(12) United States Patent
Hashimoto

(10) Patent No.: US 7,183,826 B2
(45) Date of Patent: Feb. 27, 2007

(54) HIGH HYSTERESIS WIDTH INPUT CIRCUIT

(75) Inventor: Masami Hashimoto, Himo (JP)

(73) Assignee: Seiko Epson Corporation, Tokyo (JP)

( * ) Notice: Subject to any disclaimer, the term of this patent is extended or adjusted under 35 U.S.C. 154(b) by 74 days.

(21) Appl. No.: 11/045,275

(22) Filed: Jan. 31, 2005

(65) Prior Publication Data
US 2005/0212579 A1 Sep. 29, 2005

(30) Foreign Application Priority Data
Mar. 11, 2004 (JP) ............................. 2004-069648
Mar. 11, 2004 (JP) ............................. 2004-069649

(51) Int. Cl.
H03K 3/00 (2006.01)
(52) U.S. Cl. ...................... 327/205; 327/206
(58) Field of Classification Search ............... 327/205, 327/206, 208
See application file for complete search history.

(56) References Cited

U.S. PATENT DOCUMENTS
6,340,907 B2 * 1/2002 Aoki ........................ 327/206

FOREIGN PATENT DOCUMENTS
JP  A 58-182914  10/1983
JP  A 10-154924  6/1998
JP  A 11-027114  1/1999

* cited by examiner

Primary Examiner—Long Nguyen
(74) Attorney, Agent, or Firm—Oliff & Berridge, PLC

(57) ABSTRACT

The present invention is constructed of a first input circuit having a higher logic level $V_{IH}$ made up of a first inverter circuit 22 controlled by an input signal and an N-type MOSFET 16 controlled by a latch circuit 24 which stores a preceding state, a second input circuit having a lower logic level $V_{IL}$ made up of a second inverter circuit 23 controlled by an input signal and a P-type MOSFET 15 controlled by a latch circuit which stores a preceding state and the latch circuit 24 which stores a preceding state.

3 Claims, 6 Drawing Sheets

Related Art

Related Art

Related Art

HIGH HYSTERESIS WIDTH INPUT CIRCUIT

BACKGROUND OF THE INVENTION

1. Field of the Invention

The present invention relates to a semiconductor integrated circuit using an insulated gate field-effect transistor (hereinafter referred to as "MOSFET"), and more particularly, to a hysteresis input circuit whose logic level is provided with a hysteresis characteristic to eliminate misoperation or instability due to noise when an input signal of an input circuit is changed from a high potential to a low potential or from a low potential to a high potential, capable of securing a large enough hysteresis width even when a supply voltage decreases.

2. Description of the Related Art

Conventionally, for an integrated circuit, a digital circuit in particular, a hysteresis input circuit is widely used with an input signal terminal provided with a difference in the logic level between a rise and fall of an input signal, that is, a hysteresis characteristic so as to eliminate misoperation or instability due to noise. However, with the introduction of finer integrated circuits and reduction of withstand voltages, lower supply voltages are used in recent years and it is becoming impossible to secure a sufficient hysteresis width.

This type of conventional circuit will be explained below.

A general input circuit provided with a conventional MOS integrated circuit having hysteresis constitutes a circuit equivalent to an inverter circuit and adopts a circuit structure providing two types of ratio between a P-type MOSFET conductance constant $\beta_P$ and an N-type MOSFET conductance constant $\beta_N$ which are always dominated by an input signal and which are large factors determining the logic level and changing this ratio between the two types $\beta_P$ and $\beta_N$ according to a preceding state.

FIG. 7 shows a first conventional circuit example and has a first logic level determined by P-type MOSFETs 601, 603 and an N-type MOSFET 602 and a second logic level determined by N-type MOSFETs 602, 604 and the P-type MOSFET 601. An inverter circuit 607, P-type MOSFET 605 and N-type MOSFET 606 switch between the aforementioned first logic level and second logic level according to a preceding state and create a hysteresis characteristic.

Furthermore, FIG. 8 shows a second conventional circuit example and is described in JP58-182914A.

The second conventional circuit shown in FIG. 8 has a first logic level determined by P-type MOSFETs 701, 703, 705 and N-type MOSFETs 702, 704 and a second logic level determined by N-type MOSFETs 702, 704, 706 and P-type MOSFETs 701, 703. Then, an inverter circuit 707, P-type MOSFET 705 and N-type MOSFET 706 switch between the aforementioned first logic level and second logic level according to a preceding state and create a hysteresis characteristic.

Furthermore, FIG. 9 shows a third conventional circuit example and is described in JP10-154924A.

The third conventional circuit shown in FIG. 9 has a first logic level determined by P-type MOSFETs 801, 803, 805 and N-type MOSFETs 802, 804 and a second logic level determined by N-type MOSFETs 802, 804, 806 and P-type MOSFETs 801, 803. Then, an inverter circuit 807, P-type MOSFET 805, N-type MOSFET 806 switch between the aforementioned first logic level and second logic level according to a preceding state and create a hysteresis characteristic.

Furthermore, FIG. 10 shows a fourth conventional circuit example and is described in JP11-27114A.

The fourth conventional circuit shown in FIG. 10 has a first logic level determined by P-type MOSFETs 911, 915 and N-type MOSFET 912 and a second logic level determined by N-type MOSFETs 914, 916 and P-type MOSFET 913. Then, a latch circuit 924 made up of NAND circuits 917, 918 and an inverter circuit 919, P-type MOSFET 915 and N-type MOSFET 916 switch between the aforementioned first logic level and second logic level according to a preceding state and create a hysteresis characteristic.

However, the above described conventional hysteresis input circuits have the following problems.

First, in the conventional circuits shown in FIG. 7, FIG. 8, and FIG. 9, an equivalent circuit in forming the first and second logic levels can be reduced to the inverter circuit constructed of a P-type MOSFET and N-type MOSFET shown in FIG. 6.

The logic level of the inverter circuit shown in FIG. 6 can be obtained as follows.

That is, as shown in FIG. 6, suppose conductance constants of the P-type MOSFET and N-type MOSFET are $\beta_P$ and $\beta_N$, threshold voltages are $V_{TP}$ and $V_{TN}$, respectively, a supply voltage is $V_{DD}$, a reference ground potential is 0 and a logic level is $V_{GL}$. At this time, since the driving capacity of the P-type MOSFET and N-type MOSFET are comparable in the logic level, the following Expression (1) holds.

$$\tfrac{1}{2} \cdot \beta_P (V_{DD} - V_{GL} - V_{TP})^2 = \tfrac{1}{2} \cdot \beta_N (V_{GL} - V_{TN})^2 \tag{1}$$

By solving this Expression (1), the logic level $V_{GL}$ is expressed by the following Expression (2).

$$V_{GL} = \{(V_{DD} - V_{TP} + (\beta_N/\beta_P)^{1/2} \cdot V_{TN}\} / \{1 + (\beta_N/\beta_P)^{1/2}\} \tag{2}$$

Therefore, if various forms of P-type MOSFET and N-type MOSFET are adopted and the conductance constant ratio $(\beta_N/\beta_P)$ is changed from 0 to infinity, the logic level is changed within the range of the following Expression (3).

$$V_{TN} < V_{GL} < V_{DD} - V_{TP} \tag{3}$$

At this time, a higher logic level $V_{IH}$ applies when $(\beta_N/\beta_P)$ is 0 and is expressed by the following Expression (4).

$$V_{IH} = V_{DD} - V_{TP} \tag{4}$$

On the other hand, a lower logic level $V_{IL}$ applies when $(\beta_N/\beta_P)$ is infinity and is expressed by the following Expression (5).

$$V_{IL} = V_{TN} \tag{5}$$

Therefore, a hysteresis width $V_{WHL}$ is expressed by the following Expression (6).

$$V_{WHL} = V_{DD} - V_{TP} - V_{TN} \tag{6}$$

However, it is actually impossible to set the conductance constant ratio $(\beta_N/\beta_P)$ to 0 or infinity, and therefore the hysteresis width is actually much smaller than this value.

Therefore, when the supply voltage $V_{DD}$ is a low voltage, for example, approximately 1.5 V, since $V_{TP}$ or $V_{TN}$ is approximately 0.5 V to 0.7 V, the hysteresis width becomes very small and cannot accomplish the original objective.

FIG. 5 shows this situation. In FIG. 5, when an input voltage $V_{IN}$ is $0 \leq V_{IN} \leq V_{TN}$, the N-type MOSFET does not operate, and when $V_{DD} \leq V_{TP} \leq V_{IN} - V_{DD}$, the P-type MOSFET does not operate, and therefore the logic level of the inverter circuit is limited to a range of $V_{TN} < V_{IN} < V_{DD} - V_{TP}$.

Since, the threshold voltages $V_{TP}$, $V_{TN}$ do not fluctuate during operation, when the supply voltage $V_{DD}$ decreases, the range $(V_{DD} - V_{TP} - V_{TN})$ in which the logic level is available becomes narrower and the hysteresis width becomes very small as the supply voltage decreases.

Therefore, as the conventional circuits shown in FIG. 7, FIG. 8 and FIG. 9, the hysteresis input circuit whose equivalent circuit can be reduced to an inverter circuit has a problem that it is not possible to take a sufficient hysteresis width at a low voltage.

Furthermore, during a low-voltage operation, too, if an attempt is made to set a conductance constant ratio ($\beta_N/\beta_P$) to secure the hysteresis width as much as possible, it is necessary to change the forms of P-type MOSFETs or N-type MOSFETs to an unnatural extent, resulting in problems of occupying a large chip area, reducing driving capacity or deteriorating responsivity.

Furthermore, in the fourth conventional circuit shown in FIG. 10, since an input terminal 920 is not connected to the gate electrodes of the P-type MOSFET 915 and N-type MOSFET 916, the circuit does not become the equivalent circuit of the inverter circuit shown in FIG. 6 and there are no restrictions on the logic level in FIG. 6.

However, under a design condition under which the hysteresis width should be secured, the first logic level is in effect determined by the N-type MOSFET 912 and P-type MOSFET 915, which results in the following problem.

In FIG. 10, suppose the conductance constants of the P-type MOSFET 915 and N-type MOSFET 912 are $\beta_P$, $\beta_N$ and threshold voltages are $V_{TP}$, $V_{TN}$, respectively. Furthermore, suppose the power supply voltage is $V_{DD}$, the reference ground potential is 0 and the logic level is $V_{GL}$. At this time, the following Expression (7) holds approximately.

$$V_{IL} \approx (V_{DD} - V_{TP}) - (\beta_N/\beta_P)^{1/2} \cdot (V_{DD} - V_{TN}) \quad (7)$$

Here, if the value of ($\beta_P/\beta_N$) is changed from 0 to infinity, the logic level $V_{IL}$ is expressed by the following Expression (8).

$$-\infty \leq V_{IL} \leq V_{DD} - V_{TP} \quad (8)$$

Therefore, the logic level $V_{IL}$ can be set up to a range exceeding the power supply potential. Furthermore, at this time, if a setting is made as Expression (9), the logic level $V_{IL}$ in Expression (7) is expressed by Expression (10).

$$(\beta_N/\beta_P)^{1/2} = (V_{DD} - V_{TP})/(V_{DD} - V_{TN}) \quad (9)$$

$$V_{IL} \approx 0 \quad (10)$$

Therefore, the lower limit extends more in this system as opposed to the aforementioned inverter circuit in which the lower limit of the logic level $V_{IL}$ only reaches $V_{TN}$.

However, at this time, as the condition for setting the second logic level $V_{IL}$, the setting of the ratio of $(\beta_N/\beta_P)^{1/2}$ which is the left side to $(V_{DD} - V_{TP})/(V_{DD} - V_{TN})$ which is the right side of Expression (9) is a key factor.

However, such a setting is a setting between the P-type MOSFET and N-type MOSFET which differ in nature, and therefore it is rather hard to extend the hysteresis to the very limit when a variation in manufacturing is also taken into consideration.

Furthermore, as is also understandable from Expression (8), even if the logic level $V_{IL}$ is forcibly set low and the logic level $V_{IL}$ falls below potential 0 due to a variation in volume production, there is a problem that even if the potential of an input signal of the input terminal 920 is changed within a range of the supply voltage, a latched state may continue and it may be impossible to recover the operation.

Also when the first logic level $V_{IH}$ is set, a forcible setting to secure the hysteresis width causes the logic level $V_{IH}$ to exceed the supply voltage $V_{DD}$, causes a latched state to continue, making it impossible to recover the operation.

Therefore, it is an object of the present invention to solve the above described problems and provide a hysteresis input circuit having a relatively large hysteresis width during a low-voltage operation.

It is another object of the present invention to provide a hysteresis input circuit which can realize an input circuit having a relatively large hysteresis width with a reasonable chip area.

It is a further object of the present invention to provide a hysteresis input circuit capable of setting the first logic level and second logic level determining a hysteresis characteristic so that a β ratio among MOSFETs of the same type is set, making a setting to the very limit, securing a large hysteresis width and preventing any situation in which operation is not possible due to manufacturing variations.

SUMMARY OF THE INVENTION

A high hysteresis width input circuit according to the present invention is constructed of a first input circuit having a higher logic level $V_{IH}$ made up of a first inverter circuit controlled by an input signal and an N-type MOSFET controlled by a latch circuit which stores a preceding state, a second input circuit having a lower logic level $V_{IL}$ made up of a second inverter circuit controlled by an input signal and a P-type MOSFET controlled by a latch circuit which stores a preceding state, and the latch circuit which stores a preceding state.

According to such a structure, the logic level is not determined by only the conductance constant ratio ($\beta_N/\beta_P$) of the inverter circuit controlled by only an input signal but by a combined effect with the β ratio of the MOSFET controlled by only the signal of the latch circuit storing a preceding state, and therefore restrictions on the logic level of the aforementioned inverter circuit are lifted and the range within which the logic level can be set expands.

Furthermore, providing the first input circuit including the N-type MOSFET and the second input circuit including the P-type MOSFET makes it possible to set two logic levels independently of each other, which increases the degree of freedom in setting the conductance constant ratio, makes the design easier and can increase the hysteresis width as well.

Furthermore, providing the two input circuits and a latch circuit has the effect of reducing instability even in a transitory state in which operation changes.

Furthermore, a main factor in setting the logic level is the conductance constant ratio among MOSFETs of the same type, that is, a form ratio of MOSFETs, and it is possible to set conditions reliably, which produces the effect of reducing influences of variations in the manufacturing process.

Furthermore, the present high hysteresis width input circuit provides MOSFETs having the same type of setting of the conductance constant ratio of MOSFETs and makes a reliable setting, having the effect of eliminating a danger that a difference between the design and actual processes may cause a permanently latched state.

Furthermore, the present high hysteresis width input circuit facilitates the setting of logic level values without forcibly setting the conductance constant ratio ($\beta_N/\beta_P$) of the inverter circuit to extreme values and eliminates extreme forms of MOSFETs, having the effect of realizing a circuit with a reasonable chip area.

As shown above, the present high hysteresis width input circuit has the effect of stably providing a hysteresis input circuit having a large hysteresis width, resistant to noise even when the supply voltage (operating voltage) becomes a low voltage.

Furthermore, the high hysteresis width input circuit according to the present invention is provided with an inverter circuit which is controlled by an input signal and which operates on positive and negative power supplies and includes a second N-type MOSFET on the power supply side of the positive electrode and a second P-type MOSFET on the power supply side of the negative electrode in parallel. Then, the output signal of the inverter circuit is input to the respective gate electrodes of the second N-type MOSFET and the second P-type MOSFET via a buffer circuit so that the preceding state is reflected in the logic level.

According to such a structure, the logic level is not determined by only the conductance constant ratio ($\beta_N/\beta_P$) of the inverter circuit controlled by only an input signal but by a combined effect with the conductance constant ratio of the MOSFET which is turned ON according to the preceding state, and therefore restrictions on the logic level of the aforementioned inverter circuit are lifted and the range within which the logic level can be set expands.

Furthermore, a main factor in setting the logic level is the conductance constant ratio among MOSFETs of the same type, that is, a form ratio of MOSFETs, and it is possible to set conditions reliably and there is an effect of reducing influences of variations in the manufacturing process.

Furthermore, the present high hysteresis width input circuit provides MOSFETs having the same type of setting of the conductance constant ratio of MOSFETs and makes a reliable setting, having the effect of eliminating a danger that a difference between the design and actual processes may produce a permanently latched state.

Furthermore, the present high hysteresis width input circuit facilitates the setting of logic level values without forcibly setting the conductance constant ratio ($\beta_N/\beta_P$) of the inverter circuit to extreme values and eliminates extreme forms of MOSFETs, having the effect of realizing a circuit with a reasonable chip area.

As shown above, the present invention has the effect of reliably providing a hysteresis input circuit having a large hysteresis width, resistant to noise even when the supply voltage (operating voltage) becomes a low voltage.

DETAILED DESCRIPTION OF THE PREFERRED EMBODIMENTS

With reference now to the attached drawings, embodiments of the present invention will be explained below.

(Embodiment 1)

Figure 1:
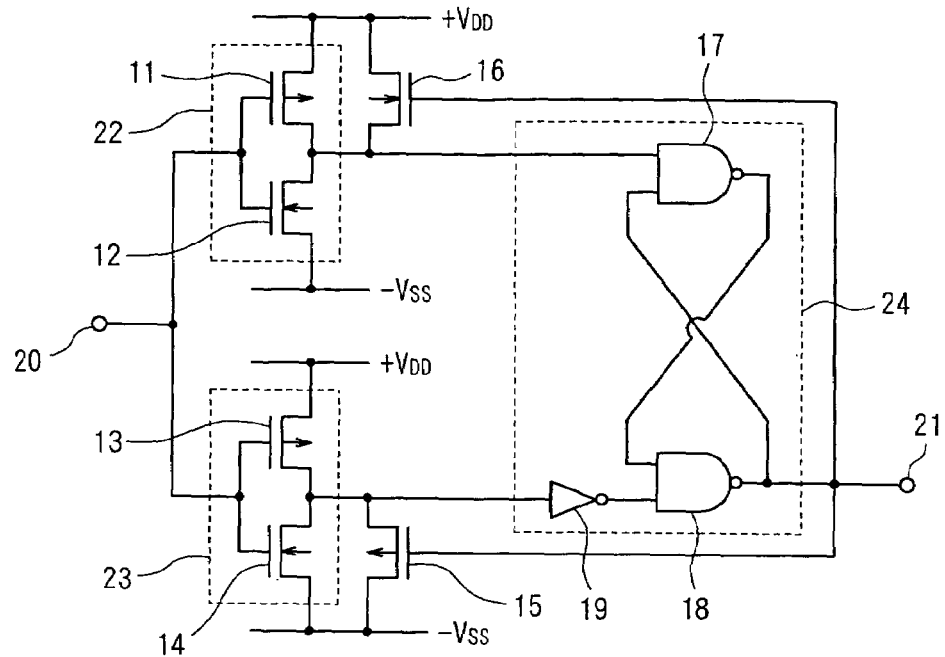
FIG. 1 is a circuit diagram showing the configuration of a first embodiment of the present invention.

FIG. 1 is a circuit diagram showing a first embodiment of the present invention.

As shown in FIG. 1, this first embodiment is provided with an inverter circuit 22, an inverter circuit 23, a latch circuit 24, an N-type MOSFET 16 and a P-type MOSFET 15 and these are formed into an integrated circuit.

The inverter circuit 22 is made up of a CMOS inverter circuit which combines a P-type MOSFET 11 and an N-type MOSFET 12 and operates on a power supply $+V_{DD}$ of a positive electrode and a power supply $-V_{SS}$ of a negative electrode.

That is, the source electrode of the P-type MOSFET 11 is connected to the power supply $+V_{DD}$ of the positive electrode. The source electrode of the N-type MOSFET 12 is connected to the power supply $-V_{SS}$ of the negative electrode. The gate electrodes of the P-type MOSFET 11 and the N-type MOSFET 12 are connected together and their common connection section is connected to an input terminal 20. Furthermore, the drain electrodes of the P-type MOSFET 11 and the N-type MOSFET 12 are connected together.

The inverter circuit 23 is made up of a CMOS inverter circuit which combines a P-type MOSFET 13 and an N-type MOSFET 14 and operates on the power supply $+V_{DD}$ of the positive electrode and the power supply $-V_{SS}$ of the negative electrode.

That is, the source electrode of the P-type MOSFET 13 is connected to the power supply $+V_{DD}$ of the positive electrode. The source electrode of the N-type MOSFET 14 is connected to the power supply $-V_{SS}$ of the negative electrode. The gate electrodes of the P-type MOSFET 13 and N-type MOSFET 14 are connected together and their common connection section is connected to the input terminal 20. Furthermore, the drain electrodes of the P-type MOSFET 13 and the N-type MOSFET 14 are connected together.

The latch circuit 24 receives output signals of the inverter circuit 22 and the inverter circuit 23 and is a circuit that stores a preceding state until both output signals of the inverter circuits 22, 23 are changed when input signals of both inverter circuits 22, 23 are changed from a high potential to a low potential or from a low potential to a high potential.

As shown in FIG. 1, this latch circuit 24 is made up of two NAND circuits (non-AND circuits) 17, 18 and an inverter circuit 19.

More specifically, the output of the NAND circuit 17 is input to a second gate of the NAND circuit 18 and the output of the NAND circuit 18 is input to a second gate of the NAND circuit 17. Furthermore, the output of the inverter circuit 22 is input to a first gate of the NAND circuit 17. The output of the inverter circuit 23 is input to the gate of the inverter circuit 19 and the output of the inverter circuit 19 is input to a first gate of the NAND circuit 18. The output of the NAND circuit 18 is extracted from an output terminal 21.

The drain electrode of the N-type MOSFET 16 is connected to the power supply $+V_{DD}$ of the positive electrode, the source electrode thereof is connected to the output terminal of the inverter circuit 22 and the gate electrode thereof is connected to the output terminal 21 of the latch circuit 24. Then, an output signal of the latch circuit 24 is input to the gate electrode thereof.

The drain electrode of the P-type MOSFET 15 is connected to the power supply $-V_{SS}$ of the negative electrode, the source electrode is connected to the output terminal of the inverter circuit 23 and the gate electrode is connected to the output terminal 21 of the latch circuit 24. The output signal of the latch circuit 24 is input to the gate electrode thereof.

Next, the operation of the first embodiment having such a structure will be explained.

Now, suppose the potential level of an input signal of the input terminal 20 is initially a low potential. At this time, the output 21 of the latch circuit 24 is at a high potential, the N-type MOSFET 16 is ON and the P-type MOSFET 15 is OFF.

Then, suppose the potential of the input signal of the input terminal 20 increases gradually and the independent logic levels of the inverter circuit 22 and inverter circuit 23 are substantially the same. In this case, the N-type MOSFET 16 of the inverter circuit 22 is ON and is trying to keep the output at a high potential, and therefore the N-type MOSFET 16 is preventing the output from becoming a low potential. On the contrary, since the P-type MOSFET 15 of the inverter circuit 23 is OFF, and therefore the output is not influenced by the P-type MOSFET 15.

Therefore, the output of the inverter circuit 23 changes from a high potential to a low potential first, the output of the inverter circuit 19 becomes high potential and is input to the first gate of the NAND circuit 18. However, the output of the NAND circuit 17 is at a low potential, and therefore the output of the NAND circuit 18 remains at a high potential and the output of the latch circuit 24 does not change.

When the potential of the input signal of the input terminal 20 further increases and the driving capacity of the N-type MOSFET 12 exceeds the total driving capacity of the P-type MOSFET 11 and N-type MOSFET 16, the output of the inverter circuit 22 changes from a high potential to a low potential. As a result, the output of the NAND circuit 17 changes from a low potential to a high potential, both the first gate and second gate of the NAND circuit 18 become high potential, and therefore the output of the NAND circuit 18 changes from a high potential to a low potential and the output of the latch circuit 24 changes from a high potential to a low potential. This causes the N-type MOSFET 16 to turn OFF and the P-type MOSFET 15 to turn ON.

As a result, the logic level determined by the inverter circuit 22 and N-type MOSFET 16 is changed and the logic level determined by the inverter circuit 23 and P-type MOSFET 15 is also changed.

Next, when the signal potential of the input terminal 20 changes from a high potential to a low potential, the N-type MOSFET 16 is OFF and the P-type MOSFET 15 is ON. Thus, the output of the inverter circuit 22 changes from a low potential to a high potential, but the output of the NAND circuit 18 is at a low potential, and therefore the output of the NAND circuit 17 remains at a high potential and the output of the latch circuit 24 does not change.

Then, when the potential of the input signal of the input terminal 20 decreases and the driving capacity of the P-type MOSFET 13 exceeds the total driving capacity of the N-type MOSFET 14 and P-type MOSFET 15, the output of the inverter circuit 23 changes from a low potential to a high potential, and is passed through the inverter circuit 19 and input to the first gate of the NAND circuit 18. For this reason, the output of the NAND circuit 18 becomes high potential and the output of the latch circuit 24 changes from a low potential to a high potential, the N-type MOSFET 16 is turned ON and the P-type MOSFET 15 is turned OFF.

As a result, the logic level determined by the inverter circuit 22 and N-type MOSFET 16 is changed again and the logic level determined by the inverter circuit 23 and P-type MOSFET 15 is also changed again. The differences in ON/OFF between the N-type MOSFET 16 and P-type MOSFET 15 constitute factors for generating hysteresis.

Next, the hysteresis characteristic of this first embodiment will be explained more specifically.

Here, suppose conductance constants of the P-type MOSFET 11, N-type MOSFET 12 and N-type MOSFET 16 are $\beta_P$, $\beta_{N1}$, $\beta_{NS}$ their threshold voltages are $V_{TP}$, $V_{TN}$, $V_{TN}$, supply voltage is $V_{DD}$ and reference ground potential is 0.

Then, suppose a high potential ($V_{DD}$) is applied to the gate electrode of the N-type MOSFET 16 causing the N-type MOSFET 16 to turn ON and the source electrode is at ($\frac{1}{2} \cdot V_{DD}$) which is half the supply voltage $V_{DD}$ when the source electrode changes in the logic level. Then, the logic level $V_{GL}$ by the three MOSFETs satisfies the following Expression (11).

$$\tfrac{1}{2} \cdot \beta_P (V_{DD} - V_{GL} - V_{TP})^2 + \tfrac{1}{2} \cdot \beta_{NS} (\tfrac{1}{2} \cdot V_{DD} - V_{TN})^2 = \tfrac{1}{2} \cdot \beta_{N1} (V_{GL} - V_{TN})^2 \quad (11)$$

Suppose the logic level $V_{GL}$ ($V_{IH}$) first satisfies the following conditional Expression (12) in order to secure the hysteresis width which is the original purpose and from the standpoint of ease of understanding.

$$V_{DD} - V_{TP} < V_{GL} < V_{DD} \quad (12)$$

This causes the P-type MOSFET 11 to enter an OFF area and the following Expression (13) holds.

$$\tfrac{1}{2} \cdot \beta_{NS} (\tfrac{1}{2} \cdot V_{DD} - V_{TN})^2 = \tfrac{1}{2} \cdot \beta_{N1} (V_{GL} - V_{TN})^2 \quad (13)$$

By solving Expression (13), the following Expression (14) is obtained.

$$V_{GL} = V_{TN} + (\beta_{NS}/\beta_{N1})^{1/2} \cdot (\tfrac{1}{2} \cdot V_{DD} - V_{TN}) \quad (14)$$

Substituting Expression (14) into Expression (12) results in the following conditional Expressions (15) and (16).

$$(V_{DD} - V_{TP} - V_{TN})^2 / (\tfrac{1}{2} \cdot V_{DD} - V_{TN})^2 < (\beta_{NS}/\beta_{N1}) \quad (15)$$

$$(\beta_{NS}/\beta_{N1}) < (V_{DD} - V_{TN})^2 / (\tfrac{1}{2} \cdot V_{DD} - V_{TN})^2 \quad (16)$$

Here, from Expression (15), it is possible to secure a large hysteresis width and when the conditional Expression (16) is satisfied, the logic level $V_{IH}$ falls within the supply voltage $V_{DD}$, which prevents the logic level $V_{IH}$ from being locked by the latch circuit 24 and prevents the operation from becoming irrecoverable.

Then, if the right side of conditional Expression (16) is expressed by F5, F5 is expressed by the following Expression (18).

$$F5 = (V_{DD} - V_{TN})^2 / (\tfrac{1}{2} \cdot V_{DD} - V_{TN})^2 \quad (18)$$

Here, a realistic relationship between $V_{TN}$ and $V_{DD}$ is $0 < V_{TN} < \tfrac{1}{2} \cdot V_{DD}$ and the range of F5 in this case becomes as the following Expression (19).

$$4 < F5 < \infty \quad (19)$$

Furthermore, when the left side of the inequality in conditional Expression (15) is expressed by F4, F4 is expressed by the following Expression (20).

$$F4 = (V_{DD} - V_{TP} - V_{TN})^2 / (\tfrac{1}{2} \cdot V_{DD} - V_{TN})^2 \quad (20)$$

Here, realistic relationships between $V_{TN}$ and $V_{DD}$ and between $V_{TP}$ and $V_{DD}$ are $0 < V_{TN} < \tfrac{1}{2} \cdot V_{DD}$ and $0<V_{TP}<\frac{1}{2}\cdot V_{DD}$, and in this case, the range of F4 is expressed by the following Expression (21).

$$1<F4<4 \qquad (21)$$

As shown above, if the conductance constant ratio ($\beta_{NS}/\beta_{N1}$) between the N-type MOSFET 16 and N-type MOSFET 12 is set to approximately 1 to 4, a hysteresis input circuit capable of taking a large hysteresis width to the very limit is realized. Too big a hysteresis width prevents an input signal from swinging up to the supply voltage and causes the input signal to be locked. To avoid this problem, when priority is given to safety over the hysteresis width, it is understandable that the conductance constant ratio ($\beta_{NS}/\beta_{N1}$) can be set to approximately 1 or below.

Setting the conductance constant ratio ($\beta_{NS}/\beta_{N1}$) to approximately 1 to 4 or approximately 1 corresponds to setting the conductance constant ratio, that is, a form ratio of the N-type MOSFET, and therefore this ratio can be set easily. More specifically, if the N-type MOSFET 16 and N-type MOSFET 12 have the same transistor channel length, the ratio between the N-type MOSFET 16 transistor width and the N-type MOSFET 12 transistor width can be set to the above described ratio.

According to Expression (11), when the N-type MOSFET 16 is OFF due to the output signal of the latch circuit 24, the following Expression (22) holds.

$$\frac{1}{2}\cdot\beta_P(V_{DD}-V_{GL}-V_{TP})^2=\frac{1}{2}\cdot\beta_{N1}(V_{GL}-V_{TN})^2 \qquad (22)$$

Thus, the logic level $V_{GL}$ of a normal inverter is expressed by the following Expression (23).

$$V_{GL}=\{V_{DD}-V_{TP}+(\beta_{N1}/\beta_P)^{1/2}\cdot V_{TN}\}/\{1+(\beta_{N1}/\beta_P)^{1/2}\} \qquad (23)$$

In Expression (23) here, if $\beta_{N1}\approx\beta$ and $V_{TP}\approx V_{TN}$, the logic level corresponds to an intermediate potential, substantially half the supply voltage.

Next, suppose conductance constants of the P-type MOSFET 13, P-type MOSFET 15 and N-type MOSFET 14 are $\beta_{P1}$, $\beta_{PS}$, $\beta_N$, respectively, threshold voltages are $V_{TP}$, $V_{TP}$, $V_{TN}$, supply voltage is $V_{DD}$, and reference ground potential is 0.

Also suppose a low potential (0) is applied to the gate electrode of the P-type MOSFET 15 causing the P-type MOSFET 15 to turn on and the source electrode has reduced to half the supply voltage $V_{DD}$ ($\frac{1}{2}\cdot V_{DD}$) when the source electrode changes in the logic level, the logic level $V_{GL}$ by the three MOSFETs satisfies the following Expression (24).

$$\frac{1}{2}\cdot\beta_{P1}(V_{DD}-V_{GL}-V_{TP})^2=\frac{1}{2}\cdot\beta_N(V_{GL}-V_{TN})^2+\frac{1}{2}\cdot\beta_{PS}(\frac{1}{2}\cdot V_{DD}V_{TP})^2 \qquad (24)$$

In order to secure the hysteresis width which is the original purpose and from the standpoint of ease of understanding, the logic level $V_{GL}$ ($V_{IL}$) satisfies the following conditional Expression (25).

$$0<V_{GT}<V_{TN} \qquad (25)$$

In this way, the N-type MOSFET 14 enters an OFF area and the following Expression (26) holds.

$$\frac{1}{2}\cdot\beta_{P1}(V_{DD}-V_{GL}-V_{TP})^2=\frac{1}{2}\cdot\beta_{PS}(\frac{1}{2}\cdot V_{DD}-V_{TP})^2 \qquad (26)$$

By solving this Expression (26), the following Expression (27) is obtained.

$$V_{GL}=(V_{DD}-V_{TP})-(\beta_{PS}/\beta_{P1})^{1/2}\cdot(\frac{1}{2}\cdot V_{DD}-V_{TP}) \qquad (27)$$

Substituting this Expression (27) into conditional Expression (25) results in the following conditional Expressions (28) and (29).

$$(V_{DD}-V_{TP}-V_{TN})^2/(\frac{1}{2}\cdot V_{DD}-V_{TP})^2<(\beta_{PS}/\beta_{P1}) \qquad (28)$$

$$(\beta_{PS}/\beta_{P1})<(V_{DD}-V_{TP})^2/(\frac{1}{2}\cdot V_{DD}-V_{TP})^2 \qquad (29)$$

Here, Expression (28) allows a large hysteresis width to be secured and when the conditional Expression (29) is satisfied, which prevents the logic level $V_{IL}$ from being locked by the latch circuit 24 within the range of the supply voltage 0 and prevents the operation from becoming irrecoverable.

Then, if the right side of conditional Expression (29) is expressed as F10, F10 is expressed by the following Expression (31).

$$F10=(V_{DD}-V_{TP})^2/(\frac{1}{2}\cdot V_{DD}-V_{TP})^2 \qquad (31)$$

Here, a realistic relationship between $V_{TP}$ and $V_{DD}$ is $0<V_{TP}<\frac{1}{2}\cdot V_{DD}$ and the range of F10 in this case is expressed by the following Expression (32).

$$4<F10<\infty \qquad (32)$$

Furthermore, if the left side of the inequality of conditional Expression (28) is expressed by F9, F9 is expressed by the following Expression (33).

$$F9=(V_{DD}-V_{TP}-V_{TN})^2/(\frac{1}{2}\cdot V_{DD}-V_{TP})^2 \qquad (33)$$

Here, a realistic relationship between $V_{DD}$ and $V_{TP}$ and relationship between $V_{TN}$ and $V_{DD}$ are $0<V_{TP}<\frac{1}{2}\cdot V_{DD}$ and $0<V_{TN}<\frac{1}{2}\cdot V_{DD}$, and in this case, F9 is expressed by the following Expression (34).

$$1<F9<4 \qquad (34)$$

As shown above, if the conductance constant ratio ($\beta_{PS}/\beta_{P1}$) between the P-type MOSFET 15 and P-type MOSFET 13 is set to approximately 1 to 4, a hysteresis input circuit whose hysteresis width can be increased to the very limit is realized. Too big a hysteresis width may cause the input signal to be locked. To avoid this problem, when priority is given to safety over the hysteresis width, it is understandable that the conductance constant ratio ($\beta_{PS}/\beta_{P1}$) can be set to approximately 1 or below.

Setting the conductance constant ratio ($\beta_{PS}/\beta_{P1}$) to approximately 1 to 4 or approximately 1 corresponds to setting the conductance constant ratio, that is, a form ratio of the P-type MOSFET, and therefore this ratio can be set easily. More specifically, if the P-type MOSFET 15 and P-type MOSFET 13 have the same transistor channel length, the ratio between the P-type MOSFET 15 transistor width and the P-type MOSFET 13 transistor width can be set to the above described ratio.

According to Expression (24), when the P-type MOSFET 15 is OFF due to the output signal of the latch circuit 24, the following Expression (35) holds.

$$\frac{1}{2}\cdot\beta_{P1}(V_{DD}-V_{GL}-V_{TP})^2=\frac{1}{2}\cdot\beta_N(V_{GL}-V_{TN})^2 \qquad (35)$$

Thus, the logic level $V_{GL}$ of a normal inverter is expressed by the following Expression (36).

$$V_{GL}=\{V_{DD}-V_{TP}+(\beta_N/\beta_{P1})^{1/2}\cdot V_{TN}\}/\{1+(\beta_N/\beta_{P1})^{1/2}\} \qquad (36)$$

In Expression (36), if $\beta_N\approx\beta_{P1}$ and $V_{TP}\approx V_{TN}$, the logic level corresponds to an intermediate potential, substantially half the supply voltage.

As shown above, in this first embodiment, the setting of the conductance constant β ratio between the N-type MOSFETs 12, 16 and P-type MOSFET 11 and the setting of the conductance constant β ratio between the P-type MOSFETs 13, 15 and N-type MOSFET 14 are close to 1 to 4, and it is not necessary to use extremely large values or small values as in the case of the conventional example.

Therefore, since the design of a layout pattern is natural, it is understandable that there are no such problems as increase of a chip area and deterioration of responsivity.

Figure 3:
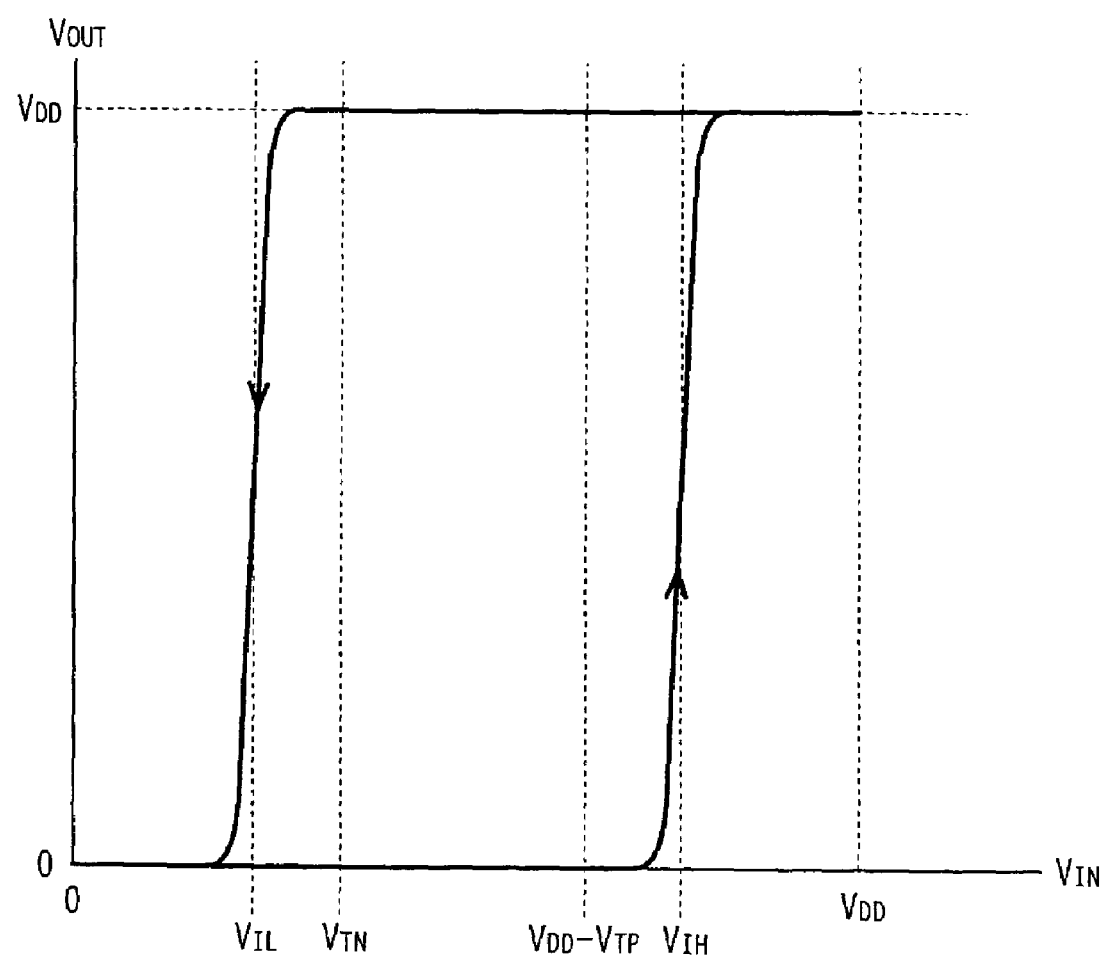
FIG. 3 is an electric characteristic illustrating a hysteresis characteristic of the circuit of the present invention.
Figure 5:
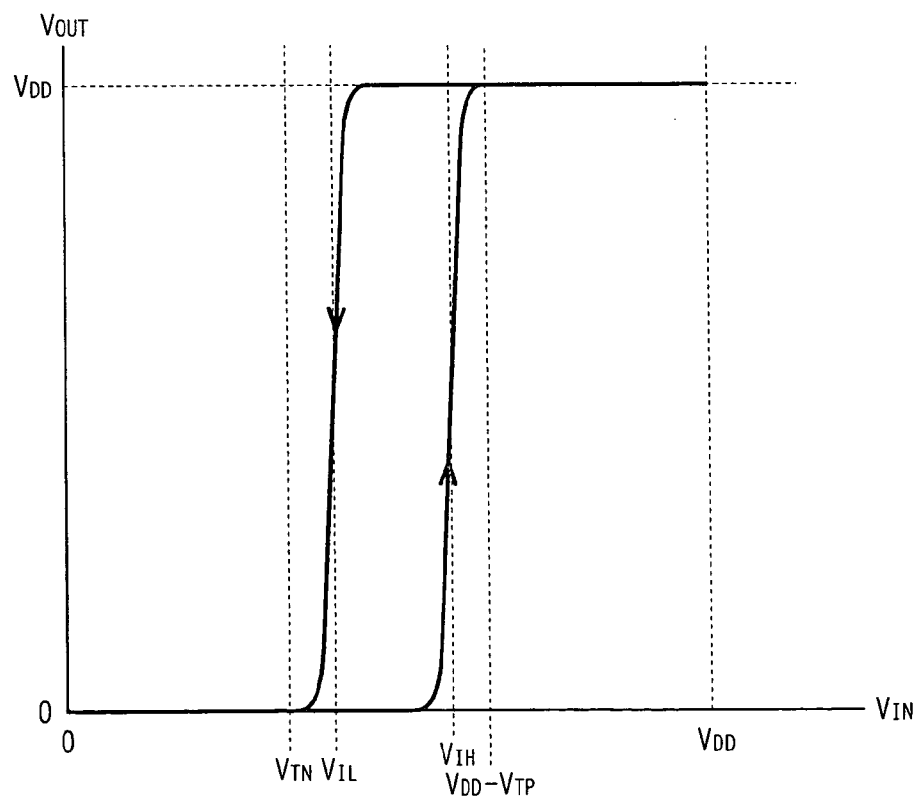
FIG. 5 is an electric characteristic illustrating a hysteresis characteristic of a conventional circuit.
Figure 6:
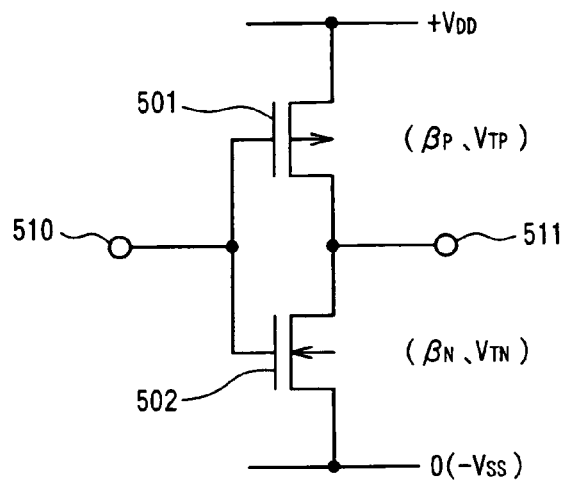
FIG. 6 is a circuit diagram showing the configuration of an inverter circuit used for a conventional circuit.
Figure 7:
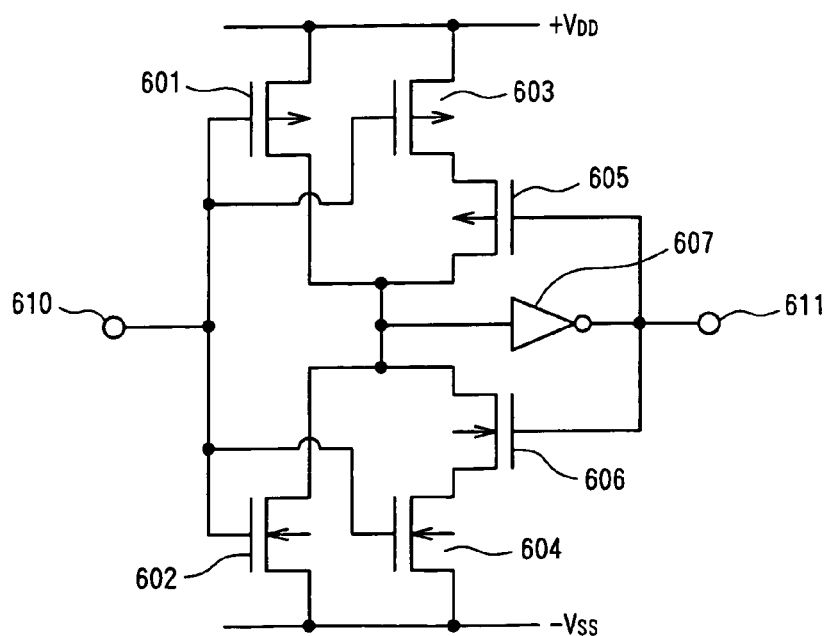
FIG. 7 is a circuit diagram showing a first example of a conventional hysteresis input circuit.
Figure 8:
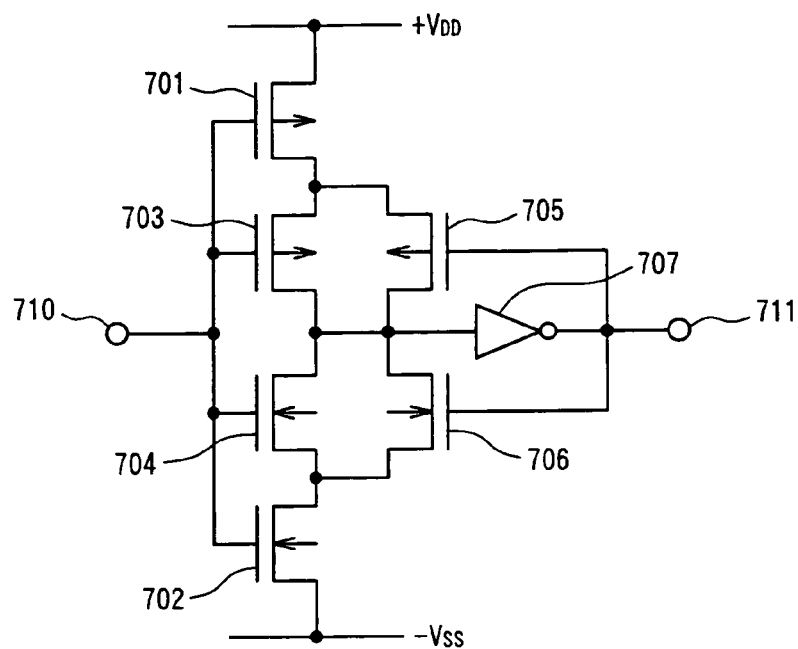
FIG. 8 is a circuit diagram showing a second example of a conventional hysteresis input circuit.
Figure 9:
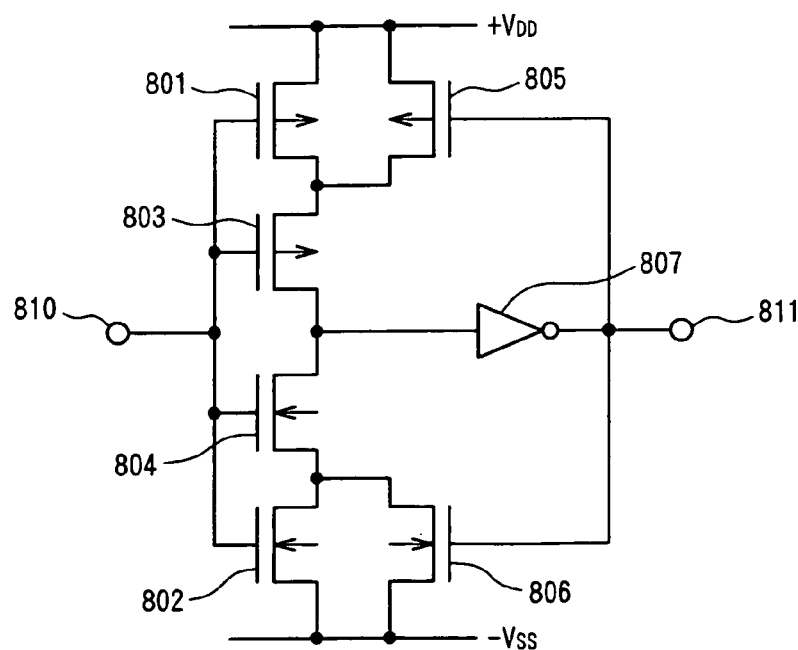
FIG. 9 is a circuit diagram showing a third example of a conventional hysteresis input circuit.
Figure 10:
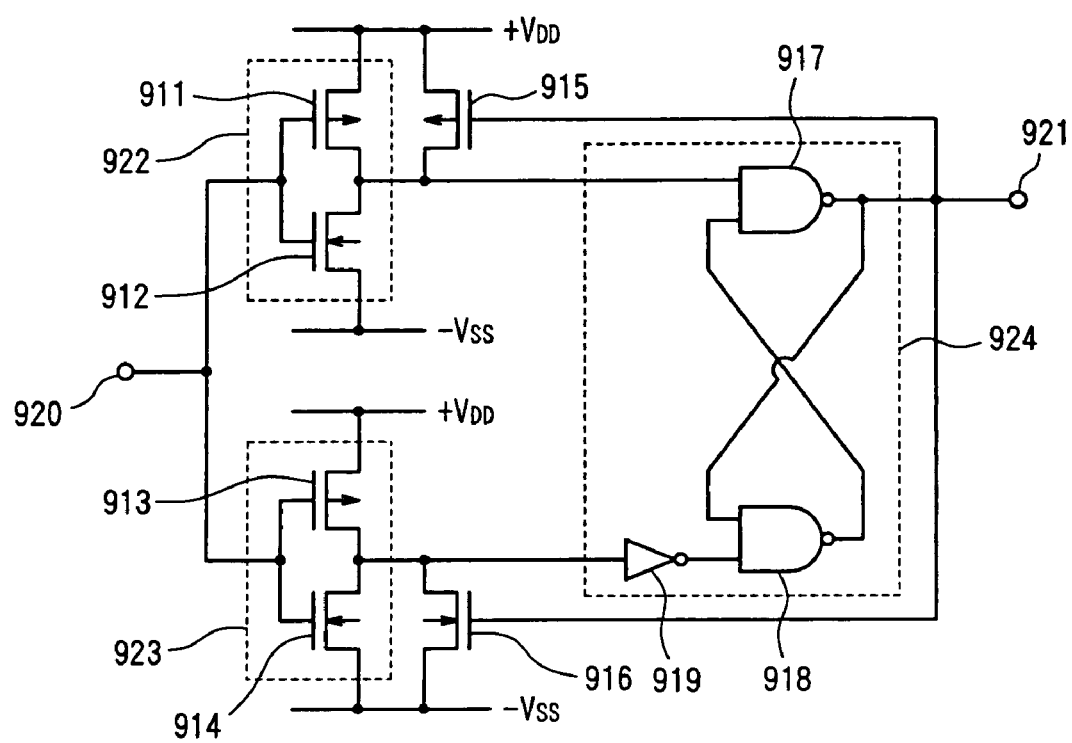
FIG. 10 is a circuit diagram showing a fourth example of a conventional hysteresis input circuit.

FIG. 3 shows that $V_{IL}$ is lower than $V_{TN}$ and that $V_{IH}$ has a higher value than ($V_{DD}$-$V_{TP}$). It is clear from FIG. 3 that a larger hysteresis width than that in FIG. 5 is secured.

(Modification Example of Embodiment 1)

The present invention is not limited to the first embodiment shown in FIG. 1. FIG. 1 shows an example of the latch circuit 24 made up of NAND circuits 17, 18 and an inverter circuit 15, but this is only an example and this latch circuit can be replaced by a latch circuit 28 made up of NOR circuits 25, 26 and inverter circuit 27 as shown in FIG. 2.

Figure 2:
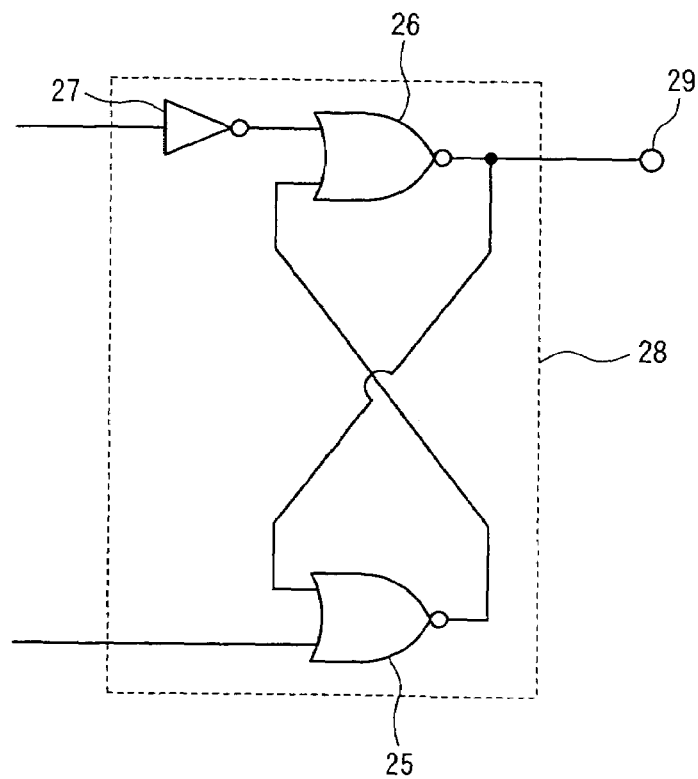
FIG. 2 is a circuit diagram showing another example of the structure of a latch circuit of the first embodiment.

In this case, however, the output of the inverter circuit 22 in FIG. 1 is connected to the input of the inverter circuit 27 in FIG. 2 and the output of the inverter circuit 23 in FIG. 1 is connected to the first gate of the NOR circuit 25 in FIG. 2.

Furthermore, regarding the setting of ($\beta_{NS}/\beta_{N1}$) of conditional Expression (16) and ($\beta_{PS}/\beta_{P1}$) of conditional Expression (29), the setting method by changing the channel width of a MOSFET transistor has been explained, but it is also possible to use a method of changing a channel length of a transistor. When the channel width is increased, $\beta$ is increased, but when the channel length is increased, $\beta$ is decreased.

Furthermore, the setting is focused on the effect of increasing a hysteresis width, but when the hysteresis width need not be increased until the hysteresis width is obtained using the above described method or when a logic level exceeding a supply voltage is set, it is not always necessary to stick to the above described conditional expression.

In such a case, too, the circuit according to the first embodiment shown in FIG. 1 facilitates the setting of a conductance constant ratio of MOSFET and is effective for efficient design of a layout pattern and securing a response speed, and therefore this modification example is applicable.

(Embodiment 2)

Figure 4:
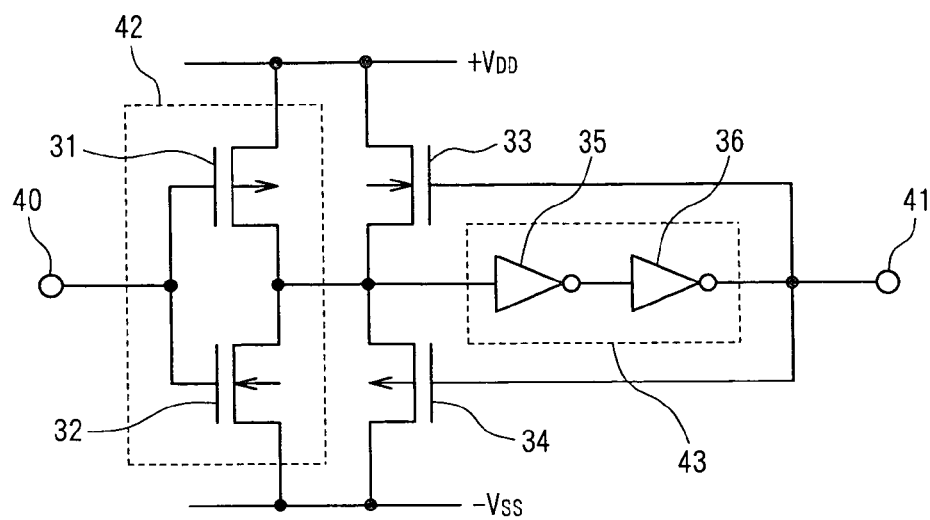
FIG. 4 is a circuit diagram showing the structure of a second embodiment of the present invention.

FIG. 4 is a circuit diagram showing a second embodiment of the present invention.

As shown in FIG. 4, this second embodiment is provided with an inverter circuit 42, a buffer circuit 43, an N-type MOSFET 33 and a P-type MOSFET 34 and these are formed into an integrated circuit.

The inverter circuit 42 is made up of a CMOS inverter circuit combining a P-type MOSFET 31 and an N-type MOSFET 32 and operates on a power supply +$V_{DD}$ of a positive electrode and a power supply -$V_{SS}$ of a negative electrode.

That is, the source electrode of the P-type MOSFET 31 is connected to the power supply +$V_{DD}$ of the positive electrode. The source electrode of the N-type MOSFET 32 is connected to the power supply -$V_{SS}$ of the negative electrode. Furthermore, both gate electrodes of the P-type MOSFET 31 and N-type MOSFET 32 are connected together and a common connection section is connected to an input terminal 40. Furthermore, the drain electrodes of the P-type MOSFET 31 and N-type MOSFET 32 are connected together.

The buffer circuit 43 is a circuit made up of two inverter circuits 35, 36 connected in series. The inverter circuits 35, 36are CMOS inverter circuits each made up of a complementary P-type MOSFET and N-type MOSFET.

The buffer circuit 43 is designed to receive an output signal of the inverter circuit 42. Furthermore, the output signal of the buffer circuit 43 is extracted from an output terminal 41.

The drain electrode of the N-type MOSFET 33 is connected to the power supply +$V_{DD}$ of the positive electrode and the source electrode is connected to the output terminal of the inverter circuit 42 and the gate electrode is connected to the output terminal 41 of the buffer circuit 43. The output signal of the buffer circuit 43 is input to the gate electrode.

The drain electrode of the P-type MOSFET 34 is connected to the power supply -$V_{SS}$ of the negative electrode and the source electrode is connected to the output terminal of the inverter circuit 42 and the gate electrode is connected to the output terminal 41 of the buffer circuit 43. The output signal of the buffer circuit 43 is input to the gate electrode.

Next, the operation of the second embodiment having such a structure will be explained.

Now, suppose the potential level of the input signal of the input terminal 40 is initially a low potential. At this time, the output of the inverter circuit 42 is at a high potential (High), the output of the buffer circuit 43 is at a high potential, the N-type MOSFET 33 is ON and the P-type MOSFET 34 is OFF.

Thereafter, when the potential of the input signal of the input terminal 40 increases gradually, the total driving capacity of the P-type MOSFET 31 and N-type MOSFET 33 contends with the driving capacity of the N-type MOSFET 32. When the driving capacity of the N-type MOSFET 32 excels, the output of the inverter circuit 42 made up of the P-type MOSFET 31 and N-type MOSFET 32 changes from a high potential to a low potential and the output of the buffer circuit 43 also changes from a high potential to a low potential. This causes the N-type MOSFET 33 to turn OFF and the P-type MOSFET 34 to turn ON.

Next, when the signal potential of the input terminal 40 changes from a high potential to a low potential, the state of the N-type MOSFET 33 is OFF and the state of the P-type MOSFET 34 is ON. For this reason, the total driving capacity of the N-type MOSFET 32 and P-type MOSFET 34 contends with the driving capacity of the P-type MOSFET 31.

When the driving capacity of the P-type MOSFET 31 excels, the output of the inverter circuit 42 made up of the P-type MOSFET 31 and N-type MOSFET 32 changes from a low potential to a high potential and the output of the buffer circuit 43 also changes from a low potential to a high potential. This causes the N-type MOSFET 33 to turn ON and the P-type MOSFET 34 to turn OFF again.

The differences in ON/OFF between the N-type MOSFET 33 and P-type MOSFET 34 are factors for generating hysteresis.

Next, the hysteresis characteristic according to this second embodiment will be explained more specifically.

The buffer circuit 43 is constructed of two stages; the inverter circuits 35, 36. For this reason, the output of the buffer circuit 43 swings up to the power supply potential at a high potential or low potential even when the input potential is an intermediate potential unless the potential exceeds the logic level as the buffer circuit 43.

Here, suppose conductance constants of the P-type MOSFET 31, N-type MOSFET 32 and N-type MOSFET 33 are $\beta_P$, $\beta_N$ and $\beta_{NS}$ respectively and their threshold voltages are $V_{TP}$, $V_{TN}$ and $V_{TN}$ and power supply voltage is $V_{DD}$ and reference ground potential is 0.

Then, suppose a high potential ($V_{DD}$) is added to the gate electrode of the N-type MOSFET 33 causing the N-type MOSFET 33 to turn ON and the potential of the source electrode is reduced to half the supply voltage $V_{DD}$ ($\frac{1}{2} \cdot V_{DD}$) when the source electrode changes in the logic level. The logic level $V_{GL}$ by the above described three MOSFETs satisfies the following Expression (41).

$$\frac{1}{2} \cdot \beta_P (V_{DD} - V_{GL} - V_{TP})^2 + \frac{1}{2} \cdot \beta_{NS} (\frac{1}{2} \cdot V_{DD} - V_{TN})^2 = \frac{1}{2} \cdot \beta_N (V_{GL} - V_{TN})^2 \quad (41)$$

The logic level $V_{GL}$ ($V_{IH}$) satisfies the following conditional Expression (42) in order to secure the hysteresis width which is the original purpose and from the standpoint of ease of understanding.

$$V_{DD} - V_{TP} < V_{GL} < V_{DD} \quad (42)$$

This causes the P-type MOSFET 31 to enter an OFF area and the following Expression (43) holds.

$$\frac{1}{2} \cdot \beta_{NS} (\frac{1}{2} \cdot V_{DD} - V_{TN})^2 = \frac{1}{2} \cdot \beta_{N1} (V_{GL} - V_{TN})^2 \quad (43)$$

By solving Expression (43), the following Expression (44) is obtained.

$$V_{GL} = V_{TN} + (\beta_{NS}/\beta_{IN})^{1/2} \cdot (\frac{1}{2} \cdot V_{DD} - V_{TN}) \quad (44)$$

Substituting Expression (44) into Expression (42) results in the following conditional Expressions (45) and (46).

$$(V_{DD} - V_{TP} - V_{TN})^2 / (\frac{1}{2} \cdot V_{DD} - V_{TN})^2 < (\beta_{NS}/\beta_N) \quad (45)$$

$$(\beta_{NS}/\beta_N) < (V_{DD} - V_{TN})^2 / (\frac{1}{2} \cdot V_{DD} - V_{TN})^2 \quad (46)$$

Here, from Expression (45), it is possible to secure a large hysteresis width and when the following conditional Expression (46) is satisfied, the logic level $V_{IH}$ falls within the range of the supply voltage $V_{DD}$, which prevents the logic level $V_{IH}$ from being locked by the circuit including the N-type MOSFET 33 and buffer circuit 43 and prevents the operation from becoming irrecoverable.

Then, if the right side of conditional Expression (46) is expressed by F5, F5 is expressed as the following Expression (48).

$$F5 = (V_{DD} - V_{TN})^2 / (\frac{1}{2} \cdot V_{DD} - V_{TN})^2 \quad (48)$$

Here, a realistic relationship between $V_{TN}$ and $V_{DD}$ is $0 < V_{TN} < \frac{1}{2} \cdot V_{DD}$ and the range of F5 in this case is expressed by the following Expression (49).

$$4 < F5 < \infty \quad (49)$$

Furthermore, the left side of the inequality in conditional Expression (45) is expressed by F4, F4 is expressed by the following Expression (50).

$$F4 = (V_{DD} - V_{TP} - V_{TN})^2 / (\frac{1}{2} \cdot V_{DD} - V_{TN})^2 \quad (50)$$

Here, realistic relationships between $V_{TN}$ and $V_{DD}$ and between $V_{TP}$ and $V_{DD}$ are $0 < V_{TN} < \frac{1}{2} \cdot V_{DD}$ and $0 < V_{TP} < \frac{1}{2} \cdot V_{DD}$, and in this case, the range of F4 is expressed by the following Expression (51).

$$1 < F4 < 4 \quad (51)$$

As shown above, if the conductance constant ratio ($\beta_{NS}/\beta_N$) between the N-type MOSFET 33 and N-type MOSFET 32 is set to approximately 1 to 4, a hysteresis input circuit capable of taking a hysteresis width to the very limit is realized. Too big a hysteresis width prevents an input signal from swinging up to the supply voltage and causes the input signal to be locked. To avoid this problem, when priority is given to safety over the hysteresis width, it is understandable that the conductance constant ratio ($\beta_{NS}/\beta_N$) can be set to approximately 1 or below. At this time, the logic level includes influences of the P-type MOSFET 31.

Setting the conductance constant ratio ($\beta_{NS}/\beta_N$) to approximately 1 to 4 or approximately 1 corresponds to setting the conductance constant ratio, that is, a form ratio of the N-type MOSFET, and therefore this ratio can be set easily. More specifically, if the N-type MOSFET 33 and N-type MOSFET 32 have the same transistor channel length, the ratio of the N-type MOSFET 33 transistor width to the N-type MOSFET 32 transistor width can be set to the above described ratio.

Next, suppose conductance constants of the P-type MOSFET 31, P-type MOSFET 34 and N-type MOSFET 32 are $\beta_P$, $\beta_{PS}$, $\beta_N$, respectively, threshold voltages are $V_{TP}$, $V_{TP}$, $V_{TN}$, supply voltage is $V_{DD}$, and reference ground potential is 0.

Also suppose a low potential (0) is applied to the gate electrode of the P-type MOSFET 34 causing the P-type MOSFET 34 to turn on and the source electrode has reduced to half the supply voltage $V_{DD}$ ($\frac{1}{2} \cdot V_{DD}$) when the source electrode changes in the logic level, the logic level $V_{GL}$ by the three MOSFETs satisfied the following Expression (54).

$$\frac{1}{2} \cdot \beta_P (V_{DD} - V_{GL} - V_{TP})^2 = \frac{1}{2} \cdot \beta_N (V_{GL} - V_{TN})^2 + \frac{1}{2} \cdot \beta_{PS} (\frac{1}{2} \cdot V_{DD} - V_{TP})^2 \quad (54)$$

In order to secure the hysteresis width which is the original purpose and from the standpoint of ease of understanding, the logic level $V_{GL}$ ($V_{IL}$) satisfies the following conditional Expression (55).

$$0 < V_{GL} < V_{TN} \quad (55)$$

In this way, the N-type MOSFET 32 enters an OFF area and the following Expression (56) holds.

$$\frac{1}{2} \cdot \beta_P (V_{DD} - V_{GL} - V_{TP})^2 = \frac{1}{2} \cdot \beta_{PS} (\frac{1}{2} \cdot V_{DD} - V_{TP})^2 \quad (56)$$

By solving this Expression (56), the following Expression (57) is obtained.

$$V_{GL} = (V_{DD} - V_{TP}) - (\beta_{PS})^{1/2} \cdot (\frac{1}{2} \cdot V_{DD} - V_{TP}) \quad (57)$$

Substituting this Expression (57) into conditional Expression (55) results in the following conditional Expressions (58) and (59).

$$(V_{DD} - V_{TP} - V_{TN})^2 / (\frac{1}{2} \cdot V_{DD} - V_{TP})^2 < (\beta_{PS}/\beta_P) \quad (58)$$

$$(\beta_{PS}/\beta_P) < (V_{DD} - V_{TP})^2 / (\frac{1}{2} \cdot V_{DD} - V_{TP})^2 \quad (59)$$

Here, Expression (58) allows a large hysteresis width to be secured and when the conditional Expression (59) is satisfied, the logic level $V_{IL}$ falls within the range of the supply voltage 0, which prevents the logic level $V_{IL}$ from being locked by the circuit including the P-type MOSFET 34 and buffer circuit 43 and prevents the operation from becoming irrecoverable.

$$(\beta_{PS}/\beta_P) < (V_{DD} - V_{TP})^2 / (\frac{1}{2} \cdot V_{DD} - V_{TP})^2 \quad (60)$$

Then, if the right side of conditional Expression (59) is expressed as F10, F10 is expressed by the following Expression (61).

$$F10 = (V_{DD} - V_{TP})^2 / (\frac{1}{2} \cdot V_{DD} - V_{TP})^2 \quad (61)$$

Here, a realistic relationship between $V_{TP}$ and $V_{DD}$ is $0 < V_{TP} < \frac{1}{2} \cdot V_{DD}$ and the range of F10 in this case is expressed by the following Expression (62).

$$4 < F10 < \infty \quad (62)$$

Furthermore, if the left side of the inequality of conditional Expression (58) is expressed by F9, F9 is expressed by the following Expression (63).

$$F9 = (V_{DD} - V_{TP} - V_{TN})^2 / (\frac{1}{2} \cdot V_{DD} - V_{TP})^2 \quad (62)$$

Here, a realistic relationship between $V_{TP}$ and $V_{DD}$ and relationship between $V_{TN}$ and $V_{DD}$ are $0<V_{TP}<\frac{1}{2}\cdot V_{DD}$ and $0<V_{TN}<\frac{1}{2}\cdot V_{DD}$, and in this case, F9 is expressed by the following Expression (64).

$$1<F9<4 \quad (64)$$

As shown above, if the conductance constant ratio ($\beta_{PS}/\beta_P$) between the P-type MOSFET 34 and P-type MOSFET 31 is set to approximately 1 to 4, a hysteresis input circuit whose hysteresis width can be increased to the very limit is realized. Too big a hysteresis width may cause the input signal to be locked. To avoid this problem, when priority is given to safety over the hysteresis width, it is understandable that the conductance constant ratio ($\beta_{PS}/\beta_P$) can be set to approximately 1 or below. At this time, the logic level includes influences of the N-type MOSFET 32, too.

Setting the conductance constant ratio ($\beta_{PS}/\beta_P$) to approximately 1 to 4 or approximately 1 corresponds to setting the conductance constant ratio, that is, a form ratio of the P-type MOSFET, and therefore this ratio can be set easily. More specifically, if the P-type MOSFET 34 and P-type MOSFET 31 have the same transistor channel length, the ratio between the P-type MOSFET 34 transistor width and the P-type MOSFET 31 transistor width can be set to the above described ratio.

As shown above, according to this second embodiment, the settings of the conductance constant ratio between the N-type MOSFETs 32, 33 and P-type MOSFETs 31, 34 are close to 1 to 4 and it is not necessary to use extremely large values or small values as in the case of the conventional example. Therefore, since the design of a layout pattern is natural, it is understandable that there are no such problems as increase of a chip area and deterioration of responsivity.

FIG. 3 shows that $V_{IL}$ is lower than $V_{TN}$ and that $V_{IH}$ has a higher value than ($V_{DD}-V_{TP}$). It is clear from FIG. 3 that a larger hysteresis width than in FIG. 5 is secured.

(Modification Example of Embodiment 2)

The present invention is not limited to the second embodiment shown in FIG. 4. In FIG. 4, the buffer circuit 43 is constructed of two stages of the inverter circuits 35, 36, but this is only an example. As shown above, the role of the buffer circuit 43 is to swing the output potential of the buffer circuit 43 up to the power supply potential and fix until it exceeds the logic level of the buffer circuit 43 even when the input signal of the buffer circuit 43 is at an intermediate potential. Therefore, other circuits may also be used instead of the buffer circuit 43 if they have the same function. For example, it is also possible to form four inverter circuits in series or combine NAND circuits and OR circuits.

Furthermore, regarding the setting of ($\beta_{NS}/\beta_N$) Of conditional Expression (46) and ($\beta_{PS}/\beta_P$) of conditional Expression (59), the setting method by changing the channel width of a MOSFET transistor has been explained, but it is also possible to use a method of changing a channel length of a transistor. When the channel width is increased, $\beta$ is increased, but when the channel length is increased, $\beta$ is decreased.

Furthermore, the setting is focused on the effect of increasing a hysteresis width, but when the hysteresis width need not be increased until the hysteresis width is obtained using the above described method or when a logic level exceeding a supply voltage is set, it is not always necessary to stick to the above described conditional Expression. In such a case, too, the circuit according to the second embodiment shown in FIG. 4 facilitates the setting of a conductance constant ratio of MOSFET and is effective for efficient design of a layout pattern and securing a response speed, and therefore this modification example is applicable.

What is claimed is:

1. A high hysteresis width input circuit using MOSFETs, comprising:

a first inverter circuit provided with a first P-type MOSFET whose source electrode is connected to a power supply of a positive electrode and a first N-type MOSFET whose source electrode is connected to a power supply of a negative electrode, with the respective gate electrodes of said both MOSFETs connected together and the respective drain electrodes connected together;

a second inverter circuit provided with a second P-type MOSFET whose source electrode is connected to the power supply of the positive electrode and a second N-type MOSFET whose source electrode is connected to the power supply of the negative electrode, with the respective gate electrodes of said both MOSFETs connected together and the respective drain electrodes connected together;

a latch circuit which receives output signals of said first inverter circuit and said second inverter circuit and stores a preceding state until the output signals of both said first and second inverter circuits change when the input signals from said first and second inverter circuits change from a high potential to a low potential or from a low potential to a high potential;

a third N-type MOSFET whose drain electrode is connected to the power supply of the positive electrode and whose source electrode is connected to the drain electrode of said first N-type MOSFET; and a third P-type MOSFET whose drain electrode is connected to the power supply of the negative electrode and whose source electrode is connected to the drain electrode of said second P-type MOSFET, the input terminals of said first inverter circuit and said second inverter circuit are connected together to receive an input signal, and the output signal of said latch circuit is extracted outside through an output terminal and input to the gate electrode of said third N-type MOSFET and the gate electrode of said third P-type MOSFET.

2. The high hysteresis width input circuit according to claim 1, wherein the conductance constant of said third N-type MOSFET is 1 to 4 times the conductance constant of said first N-type MOSFET and the conductance constant of said third P-type MOSFET is 1 to 4 times the conductance constant of said first P-type MOSFET.

3. The high hysteresis width input circuit according to claim 1, wherein the conductance constant of said first N-type MOSFET is greater than the conductance constant of said third N-type MOSFET and the conductance constant of said first P-type MOSFET is greater than the conductance constant of said third P-type MOSFET.

* * * * *